(12) United States Patent
Wang et al.

(10) Patent No.: US 10,319,651 B2
(45) Date of Patent: Jun. 11, 2019

(54) SHORTING BAR STRUCTURE AND METHOD FOR MANUFACTURING THE SAME AND THIN FILM TRANSISTOR SUBSTRATE

(71) Applicants: BOE Technology Group Co., Ltd., Beijing (CN); Fuzhou BOE Optoelectronics Technology Co., Ltd., Fujian (CN)

(72) Inventors: Yong Wang, Beijing (CN); Jaeyoung Joo, Beijing (CN); Hongyan Guo, Beijing (CN); Yang Yu, Beijing (CN); Cheong Yo Seop, Beijing (CN); Zongtian Xie, Beijing (CN); Zengyang Jiang, Beijing (CN); Cundui Tang, Beijing (CN); Huailiang Wu, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

( * ) Notice: Subject to any disclaimer, the term of this patent is extended or adjusted under 35 U.S.C. 154(b) by 0 days.

(21) Appl. No.: 15/680,328

(22) Filed: Aug. 18, 2017

(65) Prior Publication Data
US 2018/0197798 A1   Jul. 12, 2018

(30) Foreign Application Priority Data
Jan. 6, 2017 (CN) .......................... 2017 1 0009041

(51) Int. Cl.
*H01L 21/66* (2006.01)
*H01L 27/12* (2006.01)

(52) U.S. Cl.
CPC .............. *H01L 22/32* (2013.01); *H01L 22/14* (2013.01); *H01L 27/124* (2013.01)

(58) Field of Classification Search
CPC ...................................... H01L 22/32
See application file for complete search history.

(56) References Cited

U.S. PATENT DOCUMENTS 4,296,424 A * 10/1981 Shibasaki ........... H01L 21/3221
                                                    174/257
5,981,971 A * 11/1999 Miyakawa ....... G01R 31/31719
                                                    257/48

(Continued)

FOREIGN PATENT DOCUMENTS

CN   102621721 A   8/2012
CN   102768421 A   11/2012

OTHER PUBLICATIONS

First Office Action, including Search Report, for Chinese Patent Application No. 201710009041.0, dated Mar. 26, 2019, 11 pages.

*Primary Examiner* — Eugene Lee
(74) *Attorney, Agent, or Firm* — Westman, Champlin & Koehler, P.A.

(57) ABSTRACT

The present disclosure provides a shorting bar structure and a method for manufacturing the same, and a Thin Film Transistor (TFT) substrate. The shorting bar structure comprises: a test wire; a test probe contact part connected to the test wire and configured to be able to contact with a test probe; and at least one PN junction structure located between the test wire and at least one wire under test, and configured to allow a test signal to be unidirectionally transmittable in a direction from the test wire to the wire under test.

14 Claims, 6 Drawing Sheets

(56) References Cited

U.S. PATENT DOCUMENTS

| | | | | |
|---|---|---|---|---|
| 5,986,283 A | * | 11/1999 | Bush | G03F 7/70658 |
| | | | | 257/48 |
| 6,335,675 B1 | * | 1/2002 | Kakinuma | H01L 43/08 |
| | | | | 257/E43.004 |
| 2003/0117165 A1 | | 6/2003 | Kim | |
| 2003/0117536 A1 | | 6/2003 | Jeon | |
| 2003/0199111 A1 | * | 10/2003 | Hamamura | G01R 31/2812 |
| | | | | 438/17 |
| 2006/0022197 A1 | * | 2/2006 | Wirbeleit | G01R 31/2884 |
| | | | | 257/48 |
| 2007/0295381 A1 | * | 12/2007 | Fujii | H01L 31/022433 |
| | | | | 136/244 |
| 2013/0009314 A1 | * | 1/2013 | Ogawa | G06F 17/5068 |
| | | | | 257/773 |
| 2013/0027623 A1 | * | 1/2013 | Negishi | H01L 25/0753 |
| | | | | 349/42 |
| 2013/0239591 A1 | * | 9/2013 | Clarkson | F25B 21/02 |
| | | | | 62/3.7 |
| 2014/0353671 A1 | * | 12/2014 | Choi | H01L 27/3276 |
| | | | | 257/72 |

* cited by examiner

SHORTING BAR STRUCTURE AND METHOD FOR MANUFACTURING THE SAME AND THIN FILM TRANSISTOR SUBSTRATE

CROSS-REFERENCE TO RELATED APPLICATION(S)

This application claims priority to the Chinese Patent Application No. 201710009041.0, filed on Jan. 6, 2017, entitled "SHORTING BAR STRUCTURE AND METHOD FOR MANUFACTURING THE SAME AND THIN FILM TRANSISTOR SUBSTRATE," which is incorporated herein by reference in its entirety.

TECHNICAL FIELD

The present disclosure relates to the field of display device test, and more particularly, to a shorting bar structure and a method for manufacturing the same, and a thin film transistor substrate.

BACKGROUND

In a production process of a display device, performance of the device needs to be tested at each production stage in order to discover existing problems in time and ensure quality of a panel. A test probe contact manner is a test manner commonly used in test items which need to be carried out by loading a signal. For example, in a panel test (for example, a cell test) of a Thin Film Transistor-Liquid Crystal Display (TFT-LCD), the test probe contact manner is often used to load a signal onto a wire region on the panel. In this process, test probes correspond to wire regions on the panel one by one, and signals are loaded by inserting the probes into the corresponding wire regions, respectively, to connect the probes and the corresponding wire regions. However, as there is a small spacing (which is generally 38 to 40 microns) among the wires, deviation is liable to occur when the test probes contact with the wire regions, which easily causes the wires regions to be scratched, thereby affecting the test effect.

A shorting bar structure is used to realize short circuiting between data lines or gate lines corresponding to wires under test, so that the test probe is only required to contact with one of multiple wires which are short circuited during the test. The shorting bar structure can reduce the probability of occurrence of the above deviation, thereby increasing the efficiency and stability of the entire test process. However, the introduction of the shorting bar structure may increase a thickness of a border of the panel, which is undesirable. Further, in order to ensure that the panel can be used, after the test ends, the shorting bar structure must be removed by trimming (for example, laser trimming). If the shorting bar structure is not removed completely, it may cause defects, thereby affecting the quality of the panel. In addition, it also needs to invest a lot of money and manpower for the entire trimming process, which greatly increases the cost of production.

SUMMARY

In order to at least partially address the above-mentioned problems in the prior art, the present disclosure proposes a shorting bar structure and a method for manufacturing the same, and a Thin Film Transistor (TFT) substrate.

According to an aspect of the present disclosure, there is proposed a shorting bar structure. The shorting bar structure comprises: a test wire; a test probe contact part connected to the test wire and configured to be able to contact with a test probe; and at least one PN junction structure located between the test wire and at least one wire under test, and configured to allow a test signal to be unidirectionally transmittable in a direction from the test wire to the wire under test.

In an embodiment, the at least one PN structure is located above the at least one wire under test.

In an embodiment, the at least one PN structure is located below the at least one wire under test.

In an embodiment, when a test voltage to be applied is negative, a P-type semiconductor layer of the at least one PN junction structure is connected to the at least one wire under test, and an N-type semiconductor layer of the at least one PN junction structure is connected to the test wire.

In an embodiment, when a test voltage to be applied is positive, an N-type semiconductor layer of the at least one PN junction structure is connected to the at least one wire under test, and a P-type semiconductor layer of the at least one PN junction structure is connected to the test wire.

In an embodiment, the test probe contact part has a connection region and a contact region, wherein the contact region has a width greater than that of the connection region.

In an embodiment, the shorting bar structure comprises two test probe contact parts located on the two ends of the test wire, respectively.

In an embodiment, the shorting bar structure is arranged on a TFT substrate.

In an embodiment, the test wire is arranged outside a region on the TFT substrate in which bonding wires are formed.

In an embodiment, the test wire is arranged on the TFT substrate between a region in which bonding wires are formed and a region on which a color filter substrate is superimposed.

In an embodiment, the wire under test is a data line or a gate line.

According to another aspect of the present disclosure, there is proposed a method for manufacturing a shorting bar structure. The method comprises: forming a test wire in a region in which a wire under test is to be arranged; forming a test probe contact part outside the region in which the wire under test is to be arranged, so that the test probe contact part is connected to the test wire; and forming at least one PN junction structure on the test wire, wherein the PN junction structure is formed between the test wire and the wire under test to be formed, and the PN junction structure allows a test signal to be unidirectionally transmittable in a direction from the test wire to the wire under test to be formed.

According to another aspect of the present disclosure, there is proposed a method for manufacturing a shorting bar structure. The method comprises: forming at least one PN junction structure on at least one wire under test; forming a test wire connected to the PN junction structure on the PN junction structure; and forming a test probe contact part outside a region in which the wire under test is arranged, so that the test probe contact part is connected to the wire under test, wherein the PN junction structure allows a test signal to be unidirectionally transmittable in a direction from the test wire to the wire under test.

According to another aspect of the present disclosure, there is proposed a TFT substrate. The TFT substrate comprises: at least one wire under test; and at least one shorting bar structure according to the above content, wherein the shorting bar structure is connected to the wire under test.

In an embodiment, the at least one wire under test is divided into at least one group, and the at least one shorting bar structure is connected to the at least one group in one-to-one manner.

DETAILED DESCRIPTION

Specific embodiments of the present disclosure will be described in detail below. It should be noted that the embodiments described here are illustrated merely by way of example instead of limiting the present disclosure. In the following description, numerous specific details are set forth to provide a more thorough understanding of the present disclosure. However, it will be obvious to those skilled in the art that the present disclosure may be practiced without these specific details. In other instances, well-known circuits, materials or methods are not described in detail in order to avoid obscuring the present disclosure.

Reference throughout this specification to "one embodiment", "an embodiment", "one example" or "an example" means that a particular feature, structure, or characteristic described in connection with the embodiment or example is included in at least one embodiment of the present invention. Thus, the appearances of the phrase "in one embodiment", "in an embodiment", "one example" or "an example" in various places throughout this specification are not necessarily all referring to the same embodiment or example. Furthermore, the particular features, structures, or characteristics may be combined in any suitable combination and/or sub-combination in one or more embodiments or examples. In addition, those skilled in the art should understand that the accompanying drawings provided herein are for the purpose of illustration, and are not necessarily drawn to scale. A term "and/or" used herein comprises any or all combinations of one or more listed related items.

The present disclosure will be described in detail below with reference to the accompanying drawings.

Figure 1:
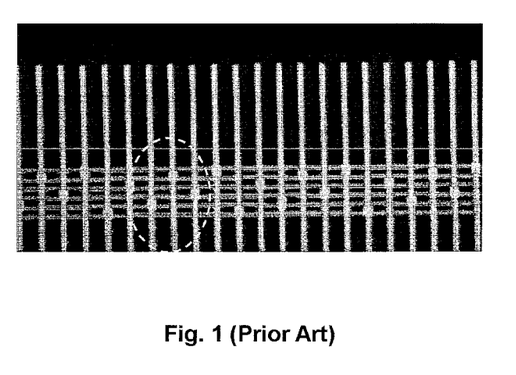
FIG. 1 illustrates a diagram of a conventional shorting bar structure.

Firstly, FIG. 1 illustrates a diagram of a conventional shorting bar structure. Vertical lines in FIG. 1 are wires under test and horizontal lines are shorting bar structures for performing short circuiting on the wires under test. Intersection points between each shorting bar structure and a number of wires under test are shown as a node (for example, four nodes are denoted by a dotted circle in FIG. 1). It can be seen that each shorting bar structure is connected to specific wires under test respectively.

Figure 2A:
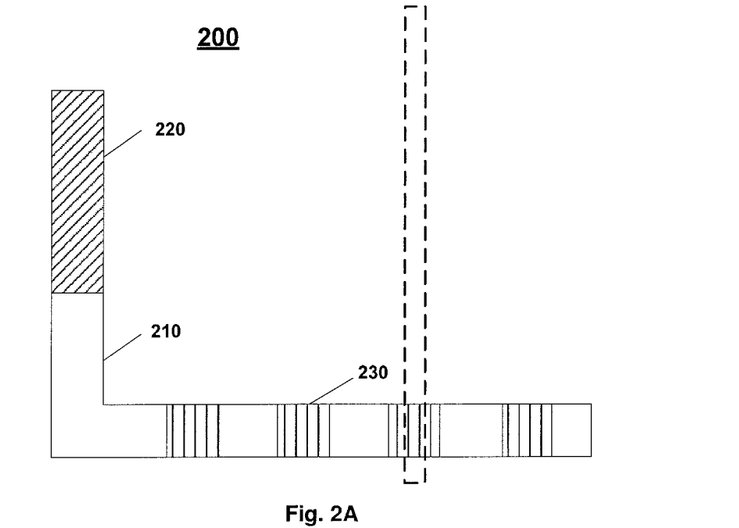
FIG. 2A illustrates a diagram of a shorting bar structure according to an embodiment of the present disclosure.
Figure 2B:
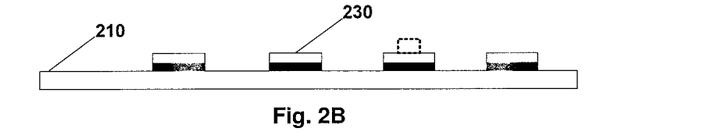
FIG. 2B illustrates a side view of a shorting bar structure according to an embodiment of the present disclosure.

FIG. 2A illustrates a diagram of a shorting bar structure 200 according to an embodiment of the present disclosure. FIG. 2B illustrates a side view of the shorting bar structure 200 according to the embodiment of the present disclosure.

As shown in FIG. 2A, the shorting bar structure 200 comprises a test wire 210 (without a padding portion), a test probe contact part 220 (with an oblique line padding portion) and at least one PN junction structure 230 (with a vertical line padding portion). The test probe contact part 220 is connected to the test wire 210 and is configured to be able to contact with a test probe. The at least one PN junction structure 230 is located between the test wire 210 and at least one wire under test (for example, as indicated by the dashed line in FIG. 2A) for connecting the test wire 210 to the wire under test and allowing a test signal to be transmittable unidirectionally in a direction from the test wire 210 to the wire under test.

It should be understood that although the test wire 210, the test probe contact part 220 and the PN junction structure 230 (and the wire under test) are shown in FIG. 2A to have specific shapes, sizes, numbers and relative positions, etc., this is only exemplary, and in the technical solutions according to the present disclosure, they can also be implemented to have other shapes, sizes, numbers and relative positions. For example, in other embodiments of the present disclosure, the test wire 210 may be a straight line. It should also be understood that although only a single wire under test connected to one PN junction structure 230 in the shorting bar structure 200 is illustrated by the dashed line in FIG. 2A, this is only exemplary, and in other embodiments of the present disclosure, the shorting bar structure 200 may also be connected to any number of wires under test. In particular, the connection conditions thereof comprise, but are not limited to, a condition of each PN junction structure 230 being connected to a single wire under test, a condition of a single PN junction structure 230 being connected to multiple wires under test, and a condition of multiple PN junction structures 230 being connected to a single wire under test and a combination thereof.

In an embodiment, the test wire 210 and the test probe contact part 220 are integrally formed.

In the side view of the shorting bar structure 200 shown in FIG. 2B, a test wire 210 and at least one PN junction structure 230 are shown, and the PN junction structure 230 is located between the test wire 210 and a wire under test (for example, as shown by the dotted line in FIG. 2B). It is to be noted that although the PN junction structure 230 is shown above the test wire 210 in FIG. 2B, this is exemplary only for illustrative purposes. In other embodiments, the PN junction structure 230 and the test wire 210 may have other positional relationships as long as the PN junction structure 230 is located between the test wire 210 and the wire under test.

As shown in FIG. 2B, the PN junction structure 230 is shown as a layered structure, i.e., a white padding layer and a gray padding layer shown in FIG. 2B. One of the white padding layer and the gray padding layer corresponds to a P-type semiconductor layer of the PN junction structure 230 and the other corresponds to an N-type semiconductor layer thereof according to positive and negative values of a test voltage (from the test wire to the wire under test) required for the test to be performed.

Specifically, when the test voltage to be applied is negative, the white padding layer corresponds to the P-type semiconductor layer of the PN junction structure 230, and the gray padding layer corresponds to the N-type semiconductor layer thereof, i.e., the P-type semiconductor layer of the PN junction structure 230 is connected to the wire under test, and the N-type semiconductor layer of the PN junction structure 230 is connected to the test wire 210. In this case, current flows along a direction from the wire under test to the P-type semiconductor layer to the N-type semiconductor layer and to the test wire 210 during the test. For a test signal having a negative voltage, this path is turned on. In addition, after the wires are bonded, the current flows along a direction from a pixel electrode to the wires and to a PCB (i.e., a printed circuit board, or a TFT substrate in this embodiment) for an operation signal having a negative voltage, and as the current direction of the operation signal having a negative voltage is opposite to a transmission direction of the signal, the transmission direction of the operation signal having a negative voltage is from the PCB to the wires and to the pixel electrode. Due to the presence of the PN junction structure 230 arranged above, the current does not flow along a direction from the test wire 210 to the N type semiconductor layer to the P type semiconductor layer to the wire (wire under test) and to the PCB, and the operation signal having a negative voltage does not pass through the shorting bar structure 200, so as not to cause short circuiting between different wires.

When the test voltage to be applied is positive, the white padding layer corresponds to the N-type semiconductor layer of the PN junction structure 230, and the gray padding layer corresponds to the P-type semiconductor layer thereof, i.e., the N-type semiconductor layer of the PN junction structure 230 is connected to the wire under test, and the P-type semiconductor layer of the PN junction structure 230 is connected to the test wire 210. In this case, current flows along a direction from the test wire 210 to the P-type semiconductor layer to the N-type semiconductor layer and to the wire under test during the test. For a test signal having a positive voltage, this path is turned on. In addition, after the wires are bonded, the current flows along a direction from a PCB to the wires and to a pixel electrode for an operation signal having a positive voltage, and as the current direction of the operation signal having a positive voltage is the same as a transmission direction of the signal, the transmission direction of the operation signal having a positive voltage is from the PCB to the wire and to the pixel electrode. Due to the presence of the PN junction structure 230 arranged above, the current does not flow along a direction from the PCB to the wire (wire under test) to the N type semiconductor layer to the P type semiconductor layer and to the test wire 210, and the operation signal having a position voltage does not pass through the shorting bar structure 200, so as not to cause short circuiting between different wires.

It can be seen that as the PN junction structure 230 is arranged, the possibility of short circuiting between wires in a bonding process is eliminated. Thus, the shorting bar structure according to the embodiment of the present disclosure does not need to be trimmed after the test, which can greatly reduce the cost.

Figure 3A:
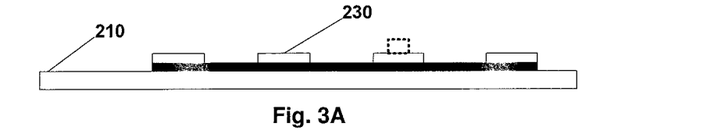
FIG. 3A illustrates a side view of a shorting bar structure according to another embodiment of the present disclosure.

FIG. 3A illustrates a side view of a shorting bar structure according to another embodiment of the present disclosure. Compared with the shorting bar structure 200 shown in FIG. 2B, in FIG. 3A, the gray padding layer (a P-type semiconductor layer or an N-type semiconductor layer) connected to the test wire 210 in the at least one PN junction structure 230 is a single layer structure which is integrally formed, and the white padding layer (an N-type semiconductor layer or a P-type semiconductor layer) connected to the wire under test is still a separate structure (i.e., as in FIG. 2B, each PN junction structure 230 corresponds to a separate white padding layer).

Figure 3B:
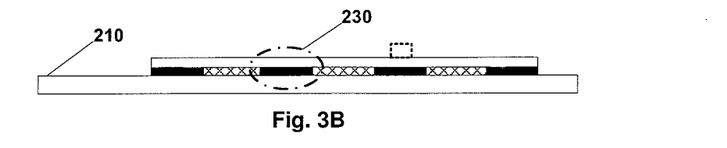
FIG. 3B illustrates a side view of a shorting bar structure according to another embodiment of the present disclosure.

FIG. 3B further illustrates a side view of a shorting bar structure according to another embodiment. Compared with the shorting bar structure shown in FIG. 3A, in FIG. 3B, the gray padding layer (a P-type semiconductor layer or an N-type semiconductor layer) connected to the test wire 210 in the at least one PN junction structure 230 is a separate structure (i.e., as in FIG. 2B, each PN junction structure 230 corresponds to a separate gray padding layer), an insulating layer (a mesh padding region) for isolation is arranged between separate gray padding layers (P-type semiconductor layers or N-type semiconductor layers), and a white padding layer (an N-type semiconductor layer or a P-type semiconductor layer) connected to the wire under test is a single layer structure which is integrally formed.

Figure 4:
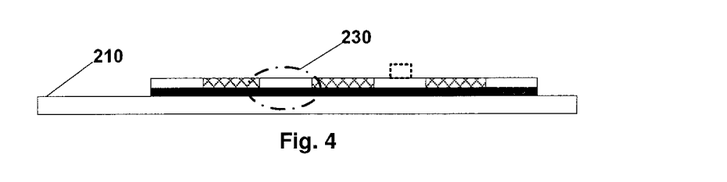
FIG. 4 illustrates a side view of a shorting bar structure according to another embodiment of the present disclosure.

FIG. 4 further illustrates a side view of a shorting bar structure according to another embodiment. Compared with the shorting bar structure shown in FIG. 3A, in FIG. 4, an insulating region (a grid padding region) for isolation is arranged between separate white padding layers (N-type semiconductor layers or P-type semiconductor layers).

It should be understood that in other embodiments, the at least one PN junction structure 230 may also be implemented as any combination of the conditions shown in FIGS. 2, 3A, 3B, and 4.

Figure 5:
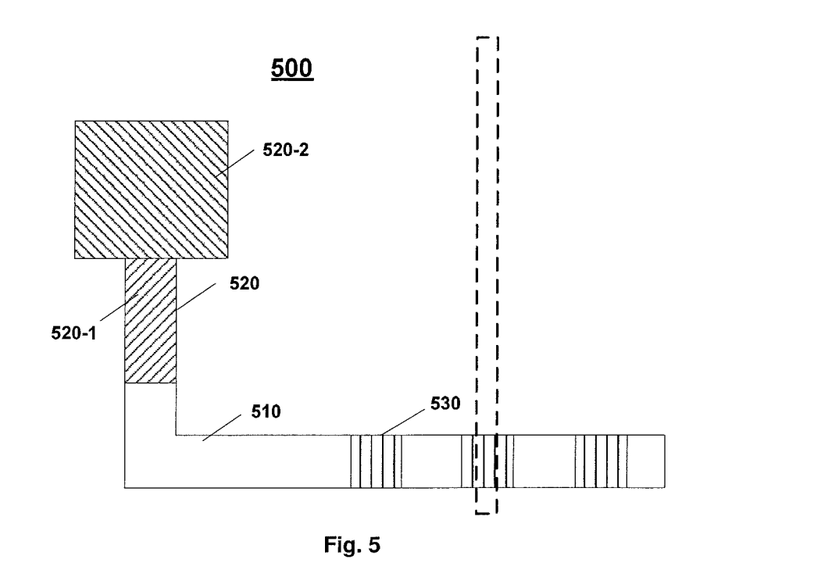
FIG. 5 illustrates a diagram of a shorting bar structure according to another embodiment of the present disclosure.

FIG. 5 illustrates a diagram of a shorting bar structure 500 according to another embodiment of the present disclosure. The shorting bar structure 500 comprises a test wire 510 (without a padding region), a test probe contact part 520 (with a diagonal line padding region), and at least one PN junction structure 530 (with a vertical line padding region). The test probe contact part 520 comprises two portions, i.e., a connection region 520-1 and a contact region 520-2. A width of the contact region 520-2 (i.e., a size thereof in a direction perpendicular to an extension direction of the test probe contact part 520) is greater than a width of the connection region 520-1. By arranging the contact region 520-2 having a greater width, it is more accurate and stable to perform probe contact, and a contact area becomes larger, which reduces the probability of burns due to large current.

Although the contact region 520-2 is shown to be rectangular in FIG. 5, it should be understood that in other embodiments of the present disclosure, the contact region 520-2 may be in any shape, such as a circle having a diameter greater than the width of the connection region 520-1.

Figure 6:
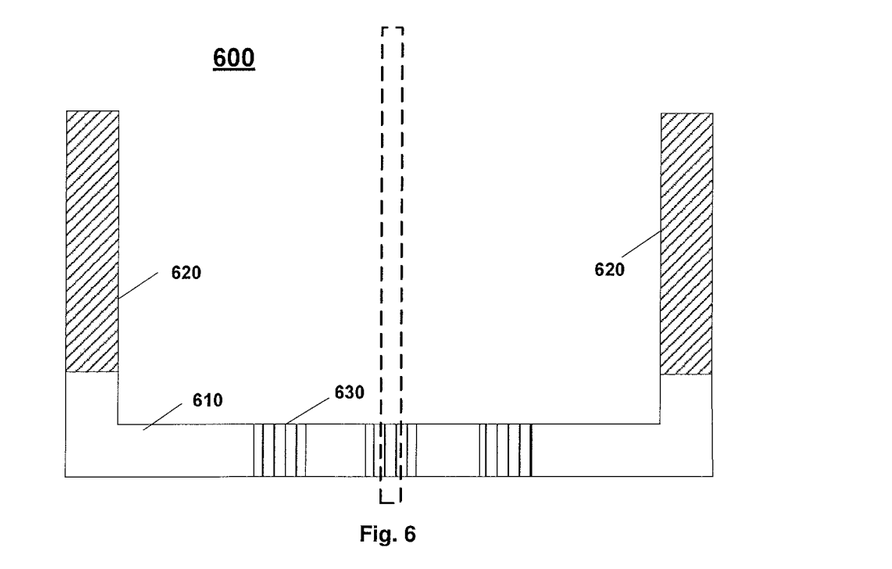
FIG. 6 illustrates a diagram of a shorting bar structure according to another embodiment of the present disclosure.

FIG. 6 illustrates a diagram of a shorting bar structure 600 according to another embodiment of the present disclosure. The shorting bar structure 600 comprises a test wire 610 (without a padding region), two test probe contact parts 620 (with a diagonal line padding region) and at least one PN junction structure 630 (with a vertical line padding region). The two test probe contact parts 620 are located at two ends of the test wire 610, respectively. The two test probe contact parts 620 are arranged to make the test operation more flexible, and when a problem is detected, a position and a cause of occurrence of the problem can be better judged by testing using the two test probe contact parts 620, respectively.

Hereinafter, a case in which a shorting bar structure according to an embodiment of the present disclosure is realized on a TFT substrate will be described with reference to FIGS. 7 to 11. It is to be understood that the use of a TFT substrate for illustration is merely exemplary, and the shorting bar structure according to the embodiment of the present disclosure may also be used in other scenarios in which the shorting bar structure is suitably applied.

The present disclosure will be described in two cases respectively for different manners in which the shorting bar structure is realized on the TFT substrate. In a first case, the test wire is formed between the TFT substrate and the wire under test; and in a second case, the wire under test is formed between the TFT substrate and the test wire.

First Case

The test wire is formed between the TFT substrate and the wire under test, i.e. the PN junction structure is located below the wire under test on the TFT substrate.

Figure 7:
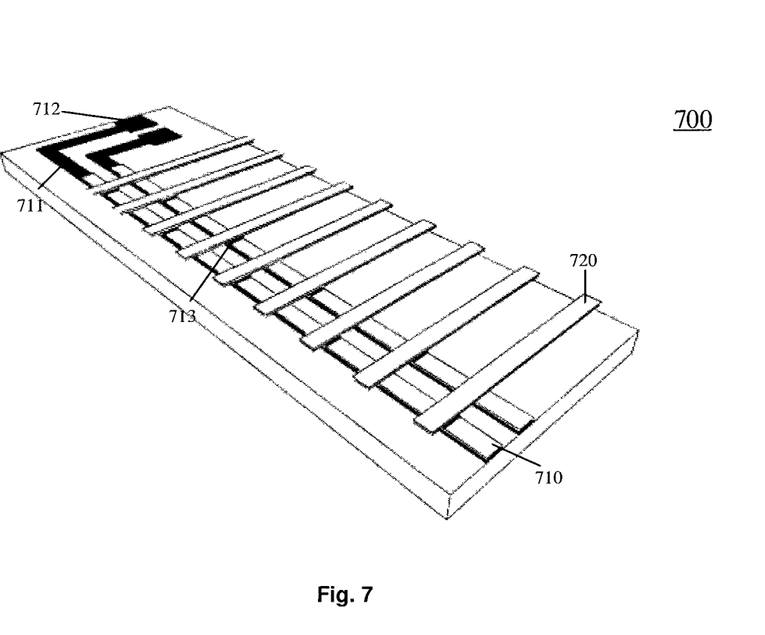
FIG. 7 illustrates a structural diagram of a TFT substrate having a shorting bar structure according to an embodiment of the present disclosure, which is realized in accordance with a first case.
Figure 8:
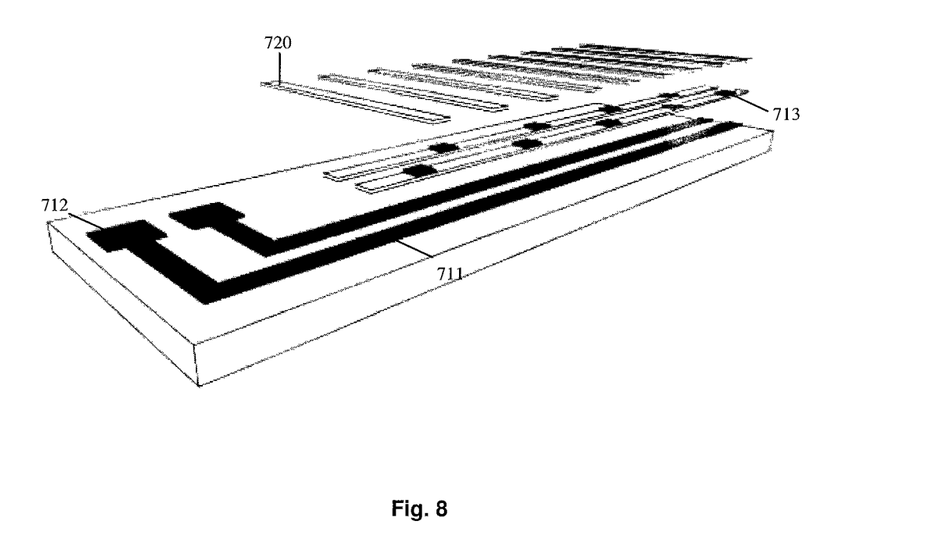
FIG. 8 illustrates an exploded structural diagram of a TFT substrate having a shorting bar structure according to an embodiment of the present disclosure, which is realized according to the first case.

FIG. 7 illustrates a structural diagram of a TFT substrate 700 having a shorting bar structure according to an embodiment of the present disclosure which is realized according to the first case. FIG. 8 illustrates an exploded structural diagram of the TFT substrate 700 having a shorting bar structure according to an embodiment of the present disclosure which is realized according to the first case.

As shown in FIGS. 7 and 8, the TFT substrate 700 has two shorting bar structures 710 and multiple wires under test 720 connected therewith respectively. It should be understood that although two shorting bar structures and multiple wires under test are shown in FIGS. 7 and 8, in other embodiments of the present disclosure, more or fewer shorting bar structures and/or wires under test may be included.

It will also be understood by those skilled in the art that the connection relationship between the shorting bar structures 710 and the wires under test 720 is not limited thereto.

In an embodiment, wires under test 720 to be used for the same function during use may be connected to the same shorting bar structure 710.

In an embodiment, the wires under test 720 may be divided into at least one group, so that the shorting bar structures 710 are connected to the at least one group in one-to-one correspondence, for example, in a 2D or 6D connection manner in the art.

Each shorting bar structure 710 comprises a test wire 711, a test probe contact part 712, and multiple PN junction structures 713. The test wire 711 and the test probe contact part 712 are arranged on a glass substrate of the TFT substrate. The PN junction structures 713 are arranged on the test wire 711, and each of the wires under test is arranged on a corresponding PN junction structure 713 and is connected to a corresponding test wire 711 through the PN junction structure 713. It is to be noted that a configuration of the test probe contact part 712 shown in FIGS. 7 and 8 is the same as that of the test probe contact part 520 shown in FIG. 5, and a configuration of the PN junction structure 713 shown in FIGS. 7 and 8 is the same as that of the PN junction structure 230 shown in FIG. 3A, but this is merely exemplary. In other embodiments, the test probe contact part 712 and the PN junction structure 713 may also have other structures.

Figure 9:
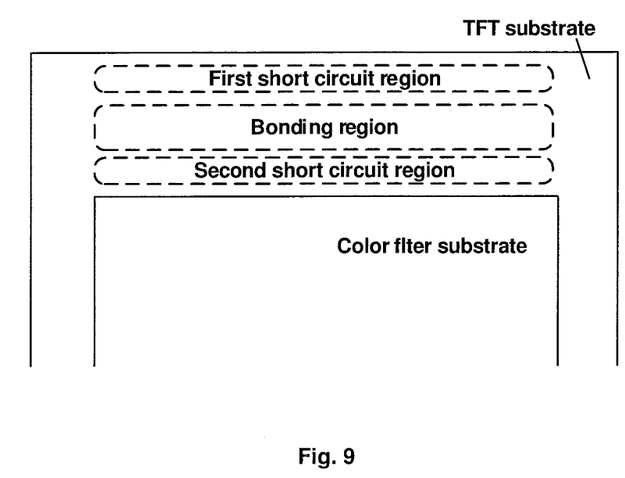
FIG. 9 illustrates a diagram of a short circuit region on a TFT substrate.

FIG. 9 illustrates a diagram of a short circuit region on the TFT substrate 700. It can be seen from FIG. 9 that, a first short circuit region, a bonding region and a second short circuit region, which are arranged in turn in a direction from an edge of the TFT substrate to an edge of a color filter substrate, are shown outside a region on the TFT substrate on which the color filter substrate is superimposed. All of the first short circuit region, the bonding region and the second short circuit region are used to arrange wires under test. Bonding wires may cover wires under test in the bonding region.

In an embodiment, as shown in FIGS. 7 and 8, the shorting bar structure 710 is arranged in the first short circuit region or the second short circuit region i.e., being arranged outside a region in which the bonding wires are formed. This arrangement can avoid destruction of the shorting bar structure in a subsequent bonding process which may affect the performance of the panel.

In an embodiment, as shown in FIGS. 7 and 8, the shorting bar structure 710 is arranged in the second short circuit region, i.e., being arranged between the region in which the bonding wires are formed and the region on which the color filter substrate is superimposed. In this case, the first short circuit region as shown in the figure may not be arranged, so that a width of an edge of the panel can be reduced, thereby improving the utilization of the TFT glass substrate.

In an embodiment, the wire under test is a data line or a gate line.

Figure 10:
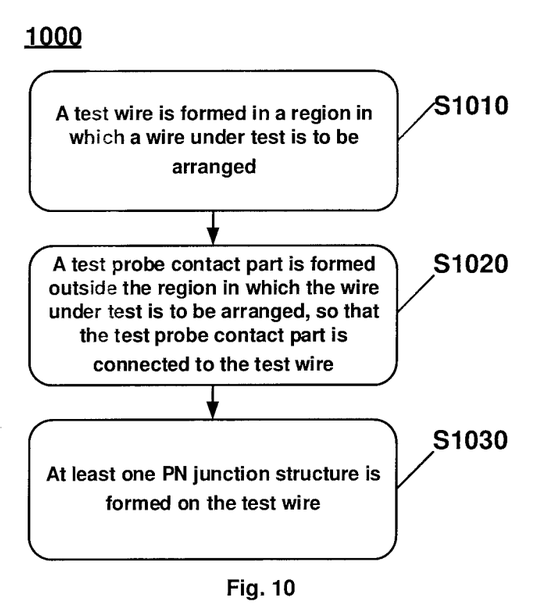
FIG. 10 illustrates a flowchart of a method for manufacturing a shorting bar structure according to the first case.

FIG. 10 illustrates a flowchart of a method 1000 for manufacturing the shorting bar structure 710 according to the first case.

In step S1010, a test wire 711 is formed in a region in which a wire under test is to be arranged.

In step S1020, a test probe contact part 712 is formed outside the region in which the wire under test is to be arranged, so that the test probe contact part 712 is connected to the test wire 711.

In step S1030, at least one PN junction structure 713 is formed on the test wire 711.

In the method 1000, the PN junction structure 713 is formed between the test wire 711 and the wire under test to be formed, and the PN junction structure 713 allows a test signal to be unidirectionally transmittable in a direction from the test wire 711 to the wire under test to be formed.

Second Case

The wire under test is formed between the TFT substrate and the test wire, that is, the PN junction structure is located above the wire under test on the TFT substrate.

Thus, the second case differs from the first case in that orders in which a wire under test, a PN junction structure and a test wire are formed on the TFT substrate are different. The structure thereof is equivalent to a structure which is obtained by turning the entire structure of the shorting bar structure and the wire under test in FIG. 7 upside down and then arranging the turned entire structure on the TFT substrate without dismantling and recombining the entire structure. Therefore, the above description of the shorting bar structure, the wire under test, the association between the shorting bar structure and the wire under test, and the arrangement region of the shorting bar structure in the first case is also applicable here and will not be described again. The method for manufacturing a shorting bar structure according to the second case will be described below with reference to FIG. 11.

Figure 11:
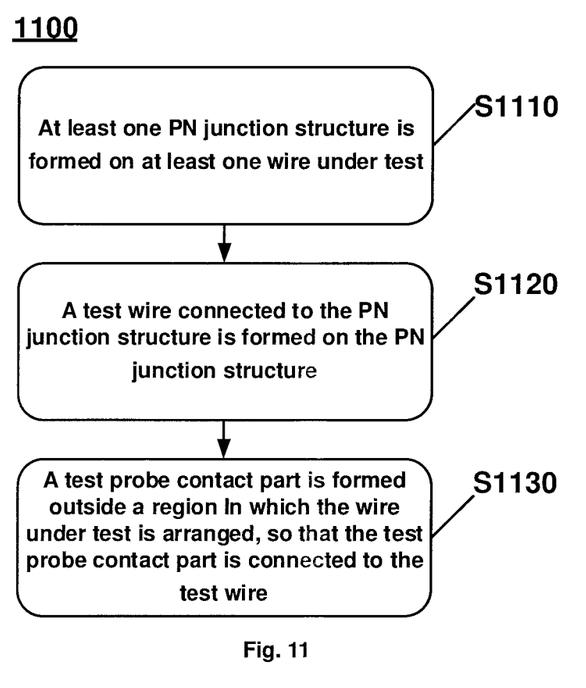
FIG. 11 illustrates a flowchart of a method for manufacturing a shorting bar structure according to a second case.

FIG. 11 illustrates a flowchart of a method 1100 for manufacturing a shorting bar structure according to the second case.

In step S1110, at least one PN junction structure is formed on at least one wire under test.

In step S1120, a test wire connected to the PN junction structure is formed on the PN junction structure.

In step S1130, a test probe contact part is formed outside a region in which the wire under test is arranged, so that the test probe contact part is connected to the test wire.

In the method 1100, the PN junction structure is formed between the wire under test and the test wire to be formed, and the PN junction structure allows a test signal to be unidirectionally transmittable in a direction from the test wire to the wire under test.

The foregoing detailed description has set forth various embodiments via the use of diagrams, flowcharts, and/or examples. In a case that such diagrams, flowcharts, and/or examples contain one or more functions and/or operations, it will be understood by those skilled in the art that each function and/or operation within such diagrams, flowcharts or examples may be implemented, individually and/or collectively, by a wide range of structures, hardware, software, firmware, or virtually any combination thereof.

While the present disclosure has been described with reference to several typical embodiments, it is apparent to those skilled in the art that the terms are used for illustration and explanation purpose and not for limitation. The present disclosure may be practiced in various forms without departing from the spirit or essence of the present disclosure. It should be understood that the embodiments are not limited to any of the foregoing details, and shall be interpreted broadly within the spirit and scope as defined by the following claims. Therefore, all of modifications and alternatives falling within the scope of the claims or equivalents thereof are to be encompassed by the claims as attached.

We claim:

1. A shorting bar structure, comprising:
    a conductive wire;
    a test probe contact part connected to the conductive wire and configured to be able to contact with a test probe; and
    at least one PN junction structure located between the conductive wire and at least one wire under test, and configured to allow a test signal to be unidirectionally transmittable in a direction from the conductive wire to the wire under test.

2. The shorting bar structure according to claim 1, wherein the at least one PN structure is located above or below the at least one wire under test.

3. The shorting bar structure according to claim 1, wherein when a test voltage to be applied is negative, a P-type semiconductor layer of the at least one PN junction structure is connected to the at least one wire under test, and an N-type semiconductor layer of the at least one PN junction structure is connected to the conductive wire.

4. The shorting bar structure according to claim 1, wherein when a test voltage to be applied is positive, an N-type semiconductor layer of the at least one PN junction structure is connected to the at least one wire under test, and a P-type semiconductor layer of the at least one PN junction structure is connected to the conductive wire.

5. The shorting bar structure according to claim 1, wherein the test probe contact part has a connection region and a contact region, and wherein the contact region has a width greater than that of the connection region.

6. The shorting bar structure according to claim 1, wherein the shorting bar structure comprises two test probe contact parts located on the two ends of the conductive wire, respectively.

7. The shorting bar structure according to claim 1, wherein the shorting bar structure is arranged on a Thin Film Transistor (TFT) substrate.

8. The shorting bar structure according to claim 7, wherein the conductive wire is arranged on the "TFT" substrate outside a region in which bonding wires are formed.

9. The shorting bar structure according to claim 7, wherein the conductive wire is arranged on the TFT substrate between a region in which bonding wires are formed and a region on which a color filter substrate is superimposed.

10. The shorting bar structure according to claim 7, wherein the wire under test is a data line or a gate line.

11. A method for manufacturing a shorting bar structure of claim 1, the method comprising:
    forming a conductive wire in a region in which a wire under test is to be arranged;
    forming a test probe contact part outside the region in which the wire under test is to be arranged, so that the test probe contact part is connected to the conductive wire; and
    forming at least one PN junction structure on the conductive wire,
    wherein the PN junction structure is formed between the conductive wire and the wire under test to be formed, and wherein the PN junction structure allows a test signal to be unidirectionally transmittable in a direction from the conductive wire to the wire under test to be formed.

12. A method for manufacturing a shorting bar structure of claim 1, the method comprising:
    forming at least one PN junction structure on at least one wire under test;
    forming a conductive wire connected to the PN junction structure on the PN junction structure; and
    forming a test probe contact part outside a region in which the wire under test is arranged, so that the test probe contact part is connected to the wire under test,
    wherein the PN junction structure allows a test signal to be unidirectionally transmittable in a direction from the conductive wire to the wire under test.

13. A Thin Film Transistor (TFT) substrate, comprising:
    at least one wire under test; and
    at least one shorting bar structure according to claim 1, wherein the shorting bar structure is connected to the wire under test.

14. The TFT substrate according to claim 13, wherein the at least one wire under test is divided into at least one group, and wherein the at least one shorting bar structure is connected to the at least one group in one-to-one manner.

* * * * *